United States Patent [19]
Yanagawa

[11] Patent Number: 5,843,848
[45] Date of Patent: Dec. 1, 1998

[54] METHOD OF PLASMA ETCHING

[75] Inventor: Shusaku Yanagawa, Kanagawa, Japan

[73] Assignee: Sony Corporation, Japan

[21] Appl. No.: 544,934

[22] Filed: Oct. 18, 1995

[30] Foreign Application Priority Data

Oct. 31, 1994 [JP] Japan ................................ 6-267148

[51] Int. Cl.$^6$ ........................... H01L 21/302; B44C 1/22
[52] U.S. Cl. ............................... 438/738; 216/7; 438/721; 438/742
[58] Field of Search ............................. 156/646.1, 643.1, 156/652.1, 656.1, 661.11; 216/77; 438/738, 742, 718, 720, 721

[56] References Cited

U.S. PATENT DOCUMENTS

| | | | |
|---|---|---|---|
| 3,994,793 | 11/1976 | Harvilchuck et al. | 204/192 |
| 4,256,534 | 3/1981 | Levinstein et al. | 156/643 |
| 5,207,868 | 5/1993 | Shinohara | 156/656 |
| 5,387,556 | 2/1995 | Xiaobing et al. | 156/643 |

FOREIGN PATENT DOCUMENTS

| | | |
|---|---|---|
| 64-30227 | 2/1964 | Japan . |
| 04306827 | 1/1992 | Japan . |
| 4-147621 | 5/1992 | Japan . |
| 06097122 | 4/1994 | Japan . |

OTHER PUBLICATIONS

Sawai, H., et al, "Reaction Mechanism of Highly Selective Etching of AlSiCu Using Brominated Gas Plasma", Dry Process Symposium, 1989, pp. 45–50.

Samukawa, Seiji, et al., "Al–4% Cu Dry Etching Technology", 33rd Symposium on Integrated Circuit, 1987, pp. 115–120.

"Technical Report", Semiconductor World, pp. 103–109, Dec. 1990.

"Reactive Ion Etching of Aluminum and Aluminum Alloys in an RF Plasma Containing Halogen Species"; J. Vac. Sci. Tech; (1978); 15(2); Schaible et. al.; abstract.

Primary Examiner—R. Bruce Breneman
Assistant Examiner—George Goudreau
Attorney, Agent, or Firm—Ronald P. Kananen

[57] ABSTRACT

There is provided a process which assures a large etching selectivity for resist mask or interlayer insulating film and excellent anisotropy and results in lesser particle contamination and after-corrosion by mainly constituting, with a decomposition byproduct of resist mask, a side wall protection film material which is indispensable for anisotropic etching in the plasma etching of an Al-based metal and by enhancing ion impact resistance and radical attack resistance through reinforcement of film quality to obtain sufficient side wall protection film even when an amount of deposition of the side wall protection film is reduced.

13 Claims, 8 Drawing Sheets

ETCHING RATE FOR EACH LAYER OF Al-BASED METAL LAYER

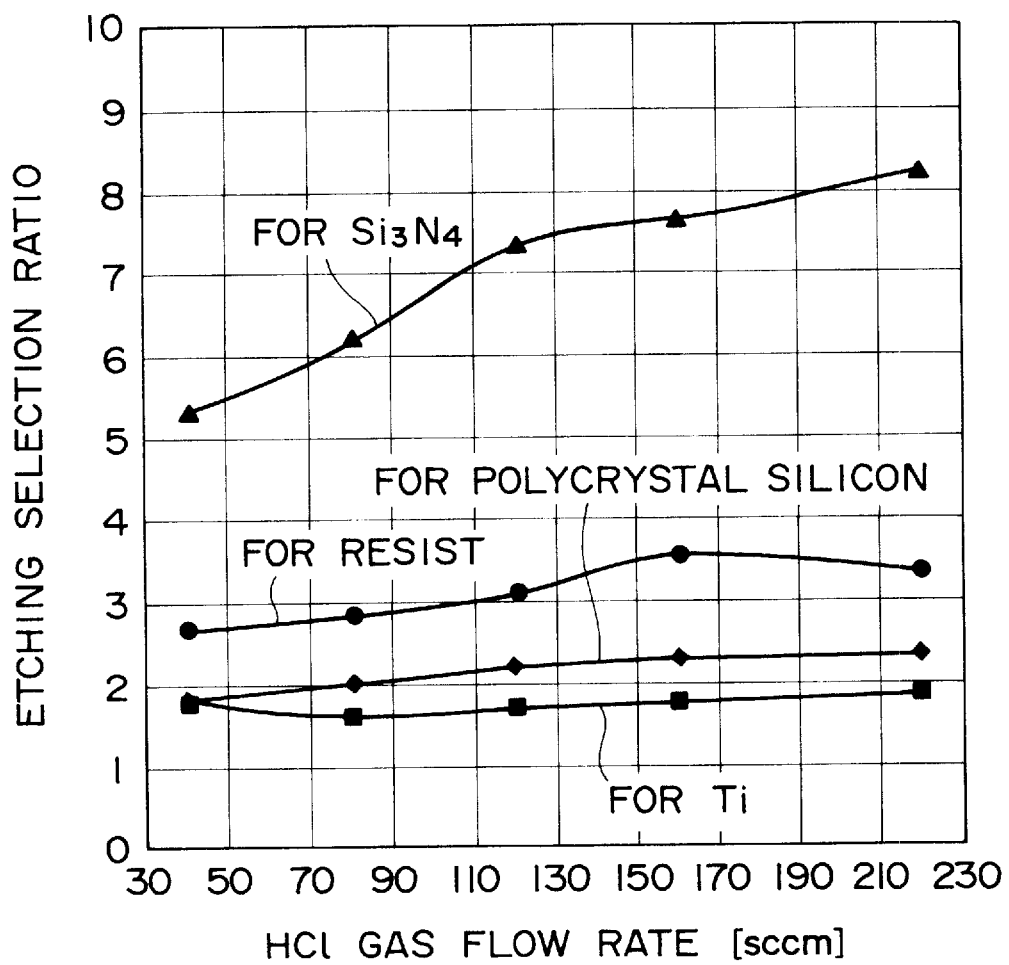

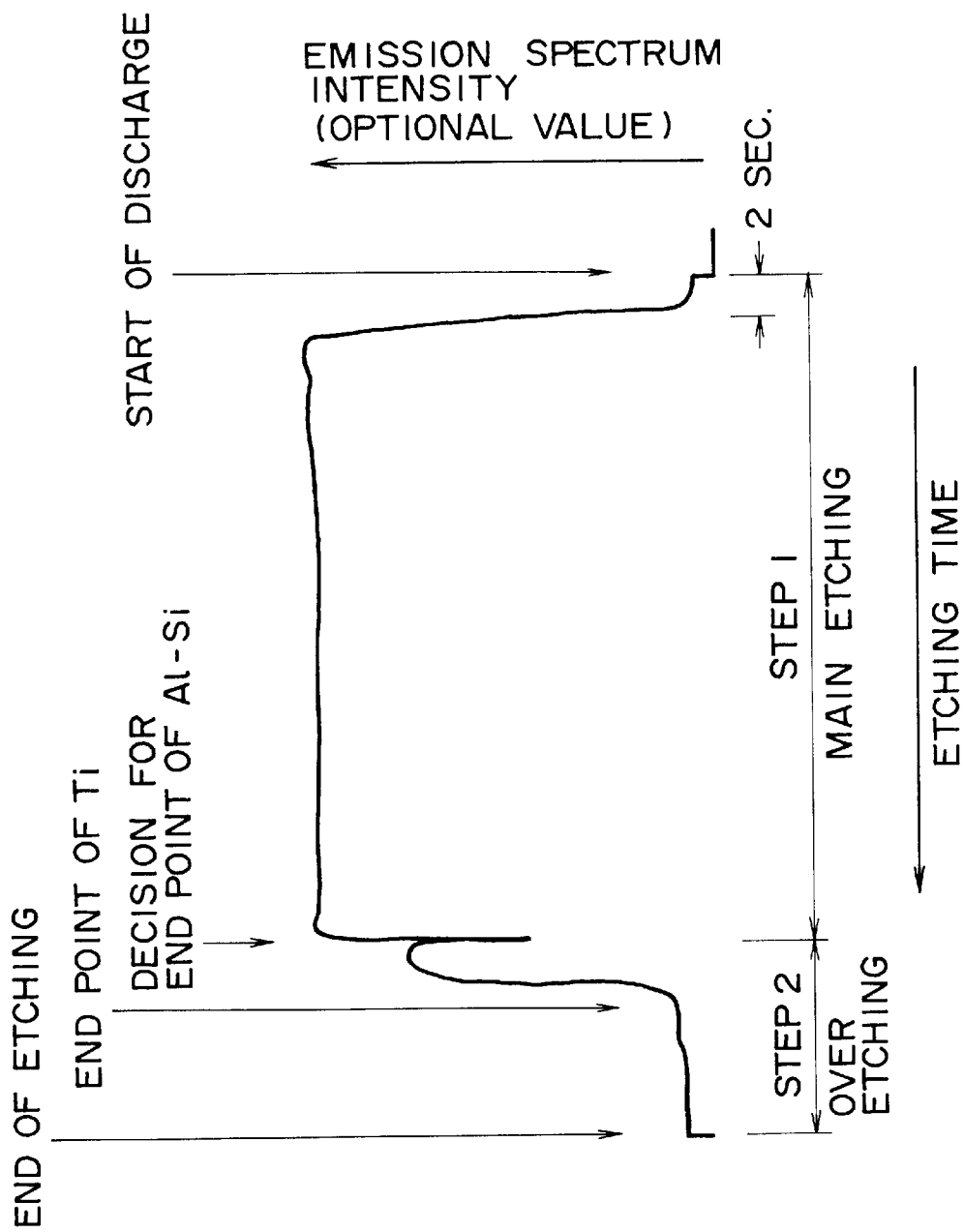

METHOD OF PLASMA ETCHING

BACKGROUND OF THE INVENTION

1. Field of the Invention

The present invention relates to a method of plasma etching for an aluminum-based metal layer which is used as an electrode and wiring, etc, of a semiconductor device and more specifically to a method of plasma etching for an aluminum-based metal wiring which has enhanced selectivity for resist mask and underlayer insulating film and reduced generation of etching residues.

2. Description of Related Art

As the materials for internal wirings and electrodes of a semiconductor device such as LSI, etc., pure aluminum (Al) and aluminum (Al)-based metals such as, aluminum-silicon (Al-Si) alloy where silicon of 1 to 2% is added to pure aluminum in order to enhance various migration-proof characteristics and moreover aluminum-silicon-copper (Al-Si-Cu) alloy where copper of 0.5 to 1% is further added to above Al-Cu alloy and aluminum-copper (Al-Cu) alloy, have been widely used. Moreover, for the upper and lower layers of the Al-based metal layer, a multilayer-structure has been employed by providing a titanium(Ti)-based material layer of Ti layer and TiN layer to enhance close contactness and barrier property with an underlayer and also providing a TiON layer to prevent reflection of exposing light beam.

For the patterning of the Al-based metal layer, plasma etching is generally conducted using the chlorine(Cl)-based gas to form a $AlCl_x$-based reaction byproduct of high vapor pressure. For instance, a patterning method using $BCl_3/Cl_2$ is disclosed in the specification of the U.S. Pat. No. 4,256,534.

In the plasma etching of the Al-based metal layer, Cl* (Cl radical) is used as the main etchant and the etching reaction proceeds voluntarily and quickly. Therefore, when only Cl* is used, isotropic etching is intensified, allowing generation of side etching. For this reason, anisotropic etching is executed by simultaneous introduction of ion assist reaction through employment of the plasma etching conditions where the vertical incident ion energy to a substrate to be processed is enhanced to a certain degree and by utilizing a decomposition byproduct of resist mask sputtered by the incident ion as a side wall protection film. Such simultaneous introduction of ion assist reaction is also necessary to suppress generation of residues by eliminating, through the sputtering method, the compounds of low vapor pressure of the reaction byproducts such as alloy elements of Si and Cu and laminated structure elements of Ti, etc. $BCl_3$ in the mixed gas is a reduction agent used for breakthrough of the native oxide existing at the surface of the Al-based metal layer and also has an important role of supplying $BCl_x^+$ as the incident ion.

Here, in the anisotropic etching where a decomposition byproduct by the sputtering of resist mask as explained above is positively used as the side wall protection film, a selectivity for resist mask and insulating film between underlayers is inevitably lowered. In the patterning of the typical Al-based metal layer by the mixed gas of $BCl_3/Cl_2$, the selectivity for resist mask is as small as 2. Under the ultra-fine design rule for the high integration semiconductor device of the sub-half micron class, the excimer laser lithography such as KrF, etc. is increasingly employed with introduction of single wavelength as the exposing beam, but the chemical amplification type resist corresponding to such excimer lithography does not always have sufficient ion incident tolerance and a problem of the resist mask selectivity is very important. Moreover, drop of selectivity for the insulating film between underlayers results in reduction of film thickness or roughness of surface due to the etching of the insulating film.

Meanwhile, under the ultra-fine design rule for the high integration semiconductor device of the sub-half micron class, it is required to reduce the coating thickness of resist to improve resolution of photolithography during the exposure. Therefore, acquisition of ultra-fine processing ability due to reduction in coating thickness of resist and acquisition of selectivity for the resist mask are in the trade-off relationship. Particularly, in the over-etching for eliminating residues at the stepped portion during the patterning of the Al-based metal layer on the underlayer of the stepped portion, a problem of the pattern conversion difference due to reduction in thickness of the resist mask is no longer in the negligible level.

In order to solve such problems, formation of a material having a higher ion impact tolerance has been attempted as a measure for reinforcing the resist mask. For example, a method where the surface of resist mask is covered with silicon Si using $SiCl_4$ as the etching gas has been reported in the Proceedings of the 33rd Symposium on Integrated Circuit (1987), p 114.

Moreover, the process using the Br-based gas such as $BBr_3$ is reported or disclosed in the Proceedings of the 11th Symposium on Dry Process, 11-2, p.45 or in the Official Gazette of the Japanese Patent Laid-Open No. Hei 1-30227. This process is necessary for enhancing tolerance for etching by covering the resist mask surface with a reaction byproduct $CBr_x$ having a low vapor pressure. A mechanism for protecting the resist mask with CBrx is explained in detail on pages 103 to 107 of the monthly magazine, "Semiconductor World" (published by Press Journal), 12, 1990 and a value 5 has been reported as the selectivity for resist mask. However, the selectivity of such level can be attained by depositing a large amount of Si or $CBr_x$, bringing about the problems of pattern conversion difference of Al-based metal wiring and excessively-tapered shape of the cross-section and moreover the probability of deterioration of particle level in the substrate and plasma etching apparatus. In addition, the patterning of the Al-based metal layer on the insulating film of the underlayer having the stepped portion probably generates residues in the shape of string extending to the lower part of the side, surface of stepped portion due to the deposition of excessive side wall protection film to result in the short-circuit between the wirings.

In addition to the method explained above, an example of plasma etching for the Al-based metal layer using the mixed gas of $Cl_2/CH_3OH$ by adding methanol which is a compound including C, H and O as the constitutional elements of resist mask has been disclosed in the official gazette of the Japanese Patent Laid-Open No. Hei 4-147621. This example has achieved the value of selectivity of 3.5 to 4, utilizing the fact that a degree of decomposition of resist mask is relatively reduced with addition of $CH_3OH$. However, the sputtering effect of an ion seed having a large mass such as $BCl^+$ cannot be expected and difficulty lies in elimination of native oxide, resulting in the problems of longer induction time (dead time) required until the etching is actually started and uniformity of the patterning.

Meanwhile, there lies a problem of after-corrosion as the phenomenon which is particular to the patterning of the Al-based metal wiring. This problem is mainly caused by residual chlorine included in a side wall protection film formed by a decomposition byproduct of resist mask and excessive formation of the side wall protection film is undesirable because it increases residual chlorine. Recently, in particular, addition of copper Cu to the Al-based metal wiring and employment of laminated structure with a material layer of different kind such as a barrier metal layer and reflection preventing layer, etc. provide some disadvantageous conditions from the point of view of preventing the after-corrosion. Therefore, further comprehensive measures for after-corrosion are expected most in current.

In addition, a residual chlorine included in the side wall protection film formed of a decomposition byproduct of resist mask changes to a rigid residue of $Al_2O_3$-based when the substrate to be processed is exposed to the air or undergoes the $O_2$ plasma ashing and this residue remains like a fence on the side surface of the Al-based metal wiring formed by the patterning to lower the step coverage of an interlayer insulating film formed on the upper layer. Moreover, when such residue is separated therefrom, the particle level on the substrate to be processed is deteriorated. Therefore, excessive formation of the side wall protection film is never preferable.

SUMMARY OF THE INVENTION

It is the first object of the present invention to provide a method of plasma etching for the Al-based metal layer which assures a large selectivity for resist mask and insulating film between underlayers, higher anisotropy and moreover does not result in particle contamination due to deposition of excessive side wall protection film and size conversion difference or residues in the shape of a string remaining at the stepped portion of the underlayers.

It is the second object of the present invention to provide a method of plasma etching for the Al-based metal layer without resulting in any etching residue even when the laminated structure of the Al-based metal layer including anti-etching elements such as Si or Cu and a Ti-based material layer is employed.

It is the third object of the present invention to provide a method of patterning for the Al-based metal wiring which does not result in any after-corrosion even for the Al-based metal wiring which has employed the laminated structure with different kinds of material.

The other objects and advantages of the present invention will be apparent from the following description in the specification in connection with the accompanying drawings thereof.

A method of patterning for the Al-based metal layer of the present invention has been proposed to solve the above listed objects and is characterized in patterning the Al-based metal layer using an etching gas mainly composed of HCl (hydrogen chloride).

Moreover, the method of patterning for the Al-based metal layer is characterized in comprising the second patterning process for over-etching of the Al-based metal layer by increasing the flow rate of the etching gas mainly composed of HCl, following the first patterning process for mainly etching the Al-based metal layer using the etching gas mainly composed of HCl.

The preferable volume ratio of HCl in the etching gas is 90% or higher but 100% or lower.

The etching gas may further include borron halogenide gas in the volume ratio under 10%. This borron halogenide gas is any one of $BCl_3$ and $BBr_2$.

The typical Al-based metal layer as a target of plasma etching by the method of the present invention is selected from pure Al, Al-Si alloy, Al-Si-Cu alloy and As-Cu alloy.

Moreover, the Ti-based material layer may be provided as the underlayer of the Al-based metal layer as the target of the plasma etching method of the present invention and this method is characterized in that the Ti-based material layer is continuously patterned, following the patterning of the Al-based metal layer.

Further, the Ti-based material layer may be provided as the upper layer of the Al-based metal layer as the target of the plasma etching method of the present invention and this method is characterized in that the Al-based metal layer is continuously patterned, following the patterning of the Ti-based material layer.

A mask for patterning of the Al-based metal layer in the plasma etching method of the present invention is a photoresist formed in the predetermined shape on the layer to be etched.

The key point of the present invention lies in enhancing the ion impact tolerance and radical attack resistance property by principally obtaining a constitutional material of the side wall protection film which is inevitable for anisotropic etching from the decomposition byproduct of resist mask and then reinforcing the film quality. Thereby, even when amount of deposition of the side wall protection film is reduced, the sufficient side wall protection effect can be attained to acquire the anisotropic shape. Meanwhile, since sufficient anisotropic shape can be obtained with reinforcement of the side wall protection film if the ion incident energy is lowered, the selectivity for resist mask and the selectivity for insulation film between underlayers can be improved.

In the present invention, a method of using only HCl gas or an etching gas including HCl of 90 vol % or higher but 100 vol % or lower is employed as the means for reinforcing the film quality of a carbon-based polymer as the side wall protection film. HCl reduces contents of halogen in the carbon-based polymer through the process that hydrogen H, which is produced as the active seeds in the plasma under the discharge dissociation condition, seizes the halogen radicals in the plasma. Moreover, with generation of a party of atoms having the polarizing structure including the ClH coupling, a degree of polymerization of the carbon-based polymer resulting from the decomposition byproduct of resist mask rises. The carbon-based polymer of the structure explained above increases chemical and physical stability and thereby reinforces the film quality of the side wall protection film to enhance the effect for protecting the side surface of pattern from the attack of incident ion and radical. Moreover, reduction in contents of halogen in the side wall protection film is also effective for prevention of after-corrosion.

As explained above, since the film quality of the carbon-based polymer as the side wall protection film can be reinforced, the incident ion energy required for anisotropic processing can be reduced and the selectivity for resist mask can also be improved. Thereby, a resist mask which can sufficiently be put into practical use can be formed with a photoresist coating film which is thinner than that in the related art and it contributes to improvement of resolution in the lithography and can reduce the processing size conversion difference. Moreover, since the film thickness of the side wall protection film shows sufficient effect even if it is thinner than that in the related art, various disadvantages such as pattern shift, stringer, residue in the shape of a fence, particle contamination and after-corrosion, etc. can be reduced.

Moreover, the incident ion energy reduction effect naturally brings about improvement of the selectivity for the underlayer and thereby removal and surface roughness of the underlayer insulating film by the sputtering can be reduced to improve reliability of semiconductor device.

Seizure of halogen radical, that is, Cl* in the plasma by the active hydrogen provides an effect to control unwanted excessive reaction of radical because excessive Cl* on the substrate to be processed is reduced. Namely, it is effective for prevention of side etching of the Al-based metal layer pattern.

In addition, the native oxide at the surface of the Al-based metal layer is removed through reduction thereof by the active hydrogen H which is generated in the plasma due to the dissociation of HCl. Therefore, if $BCl_3$ is not used like the related art or if only a small amount of $BCl_3$ is added, only a very short period of lag-time is generated, without giving any influence on the throughput of the process.

The present invention introduces such a technical concept as the basic principle and also provides a method searching for further higher selectivity. In this method, the plasma etching is divided into two steps, that is, the plasma etching of the Al-based metal layer is carried out by the first patterning process assuring a low selectivity for silicon Si and the second patterning process assuring a high selectivity for the insulating film between underlayers.

Namely, as will be explained in the embodiments to be described later, in the plasma etching of the Al-based metal layer mainly consisting of HCl, a flow rate of HCl is closely related with the selectivity for etching of polycrystal silicon and silicon nitride. Since the selectivity for polycrystal silicon is small in the region where the flow rate of HCl is comparatively small, amount of residue of Si during the main etching of the Al-based metal layer such as Al-Si of 1% can be reduced. Meanwhile, since the selectivity for etching of silicon nitride is large in the region where the flow rate of HCl is comparatively large, it is effective for reduction of surface roughness and removal of film of the insulating film between the underlayers. As explained above, the optimum selectivity can be set respectively to the main etching and over etching only by changing over the flow rate of HCl gas. The Japanese Patent Publication No. Hei 3-81298 is known as the prior art regarding the plasma etching of the Al-based metal layer by the etching gas including HCl. In this prior art, the H (hydrogen)-based gas such as H2 and HCl is added, as the additive element, in the 0 to 10 Vol % to the etching gas mainly composed of $BCl_3$ and $CCl_4$. Namely, this prior art is different from the present invention in such a point of the constitution that an inorganic mask such as silicon nitride is used.

BRIEF DESCRIPTION OF THE DRAWINGS

FIG. 1 shows schematic cross-sectional views for explaining the first embodiment of the present invention in the processing sequence. FIG. 1A illustrates the condition that a Ti layer and an Al-based metal layer are formed on an interlayer insulating film and moreover a resist mask is also formed, while

FIG. 6 shows a relationship between a selectivity for etching of the Al-based metal layer of each material layer and a flow rate of HCl in the third embodiment of the present invention.

FIG. 7 shows schematic cross-sectional views for explaining the fourth embodiment of the present invention in the processing sequence. FIG. 7A illustrates the condition that a Ti layer and an Al-based metal layer are formed on an interlayer insulating film and moreover a resist mask is also formed, while

FIG. 8 shows variation with time of emission spectrum intensity of aluminum Al in the fourth embodiment of the present invention.

DETAILED DESCRIPTION OF THE PREFERRED EMBODIMENTS

Figure 1A:
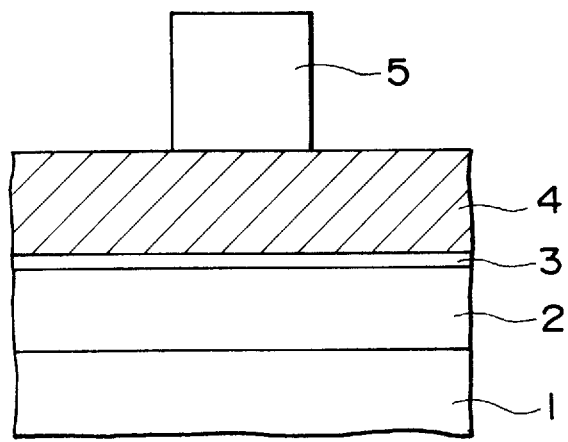

The preferred embodiments of the present invention will now be described with reference to the accompanying drawings. In each embodiment described hereunder, a substrate bias impression type ECR plasma etching apparatus is used as the etching apparatus. Use of a continuous processing apparatus connecting an inline ashing apparatus through a gate valve makes much contribution to prevention of throughput and after-corrosion.

The first embodiment of the present invention suggests an example that the Al-based metal wiring is patterned in the single step using an etching gas composed of only HCl. This example will be explained with reference to FIGS. 1A to 1C and FIG. 2.

A substrate to be processed used in this embodiment has a structure that a Ti layer 3 which is formed as a closely contacted layer on an interlayer insulating film 2 consisting of silicon nitride formed on a semiconductor substrate 1 of silicon Si, etc., an Al-based metal layer 4 consisting of Al-Si of 1% and a resist mask 5 are sequentially formed. So far as the thickness of each layer is concerned, for example, the interlayer insulating film 2 is formed in the thickness of 400 n by the p-CVD method, while the Ti layer 3 is deposited in the thickness of 100 nm and the Al-based metal layer 4 is also deposited in the thickness of 1.1 µm by the sputtering method, respectively. Moreover, the resist mask 5 is patterned in the thickness of 2.4 µm and in the width of 0.5 µm by the novolac-based positive resist. It is also possible to provide a structure that the interlayer insulating film 2 is provided with an aperture as a connecting hole not illustrated to form an ohmic contact between an active layer (not illustrated) of the diffused layer of the semiconductor substrate 1 and the Ti layer 3 or the Al-based metal layer 4. A thick Al-based metal layer like this substrate to be processed is used, as an example, for the second layer wiring of a bipolar IC.

The substrate to be processed shown in FIG. 1A is set on a substrate stage of a substrate bias impression type ECR plasma etching apparatus and the laminated films including the Al-based metal layer 4 and Ti layer 3 are etched one after the other, as an example, under the following plasma etching condition.

Flow rate of HCl: 80 sccm
Gas pressure: 2.1 Pa
Microwave current: 300 mA (2.45 GHz)
RF bias power: 25 W (2 MHz)
Substrate temperature: 30° C.

Here, the substrate temperature is kept constant by circulating 15 sccm of helium He as the heat conduction gas toward the rear surface of the substrate to be processed from the upper surface of the temperature-controlled substrate stage. In this patterning process, the radical reaction using Cl* generated by discharge dissociation of HCl as the main etching seed is carried out as follows, that is, the etching proceeds in the mechanism assisted by ions such as $Cl_x^+$ and a multilayer film including the Al-based metal layer 4 and Ti layer 3 is removed without generation of residue while reaction byproducts $AlCl_x$, $TiCl_x$ are formed.

Figure 1B:
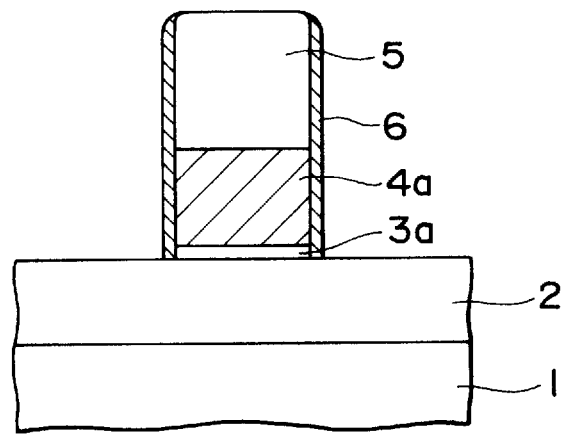
FIG. 1B illustrates the condition that the plasma etching is conducted for both Al-based metal layer and the Ti layer during formation of a side wall protection film and FIG. 1C illustrates the condition that the resist mask and side wall protection film are removed to complete the Al-based metal layer pattern.

Simultaneously, a side wall protection film 6 composed of a carbon-based polymer derived from a decomposition byproduct of the resist mask 5 is formed at the side surfaces of the Ti layer pattern 3a, the Al-based metal layer pattern 4a and resist mask, making contribution to an anisotropic processing. The side wall protection film 6 in this embodiment is formed extending to the upper part of side wall (shoulder region) of the resist mask 5 and therefore there is no reduction of film in the width direction (drop of shoulder region) of the resist mask 5, making contribution to reduction of size conversion difference. Further, the carbon-based polymer constituting the side wall protection film 6 in this embodiment contains a lesser amount of Cl than the side wall protection film formed by the conventional process utilizing a mixed gas of $BCl_3/Cl_2$ and is formed rigid with a higher degree of polymerization because the active seeds of hydrogen H generated by the discharge dissociation of HCl seize Cl*. This carbon-based polymer is generated in a lesser amount than that generated under the conventional etching conditions because the RF bias is set to a lower value, but the side wall protection film 6 shows a higher etching-proof property for making contribution to anisotropic processing of the Al-based metal wiring. Control of the radical reaction by the effect that Cl* is seized by the active seeds of hydrogen H also contributes to prevention of the side etching. In FIG. 1B, the side wall protection film 6 is illustrated to have exaggerated thickness, but it is actually a very thin film and provides a little generation of the pattern conversion difference due to excessive formation of the side wall protection film.

The end point of etching of the Al-based metal layer 4 is designated to the point where the surface of the interlayer insulating film 2 consisting of silicon nitride as the underlayer is exposed and an emission intensity of the intrinsic spectrum of 396 nm based on the Al plasma emission starts to become lower and moreover an over-etching of 40% is further conducted. With this over-etching, remaining part of the Al-based metal layer 4 and the Ti layer 3 have been removed. An etching rate of the Al-based metal layer 4 is set to 1050 nm/min, while that of the Ti layer is set to 650 nm/min, respectively. In addition, the etching selectivity of the Al-based metal layer 4 for the resist has been 2.8, while that for interlayer insulating film has been 6.2.

Figure 2:
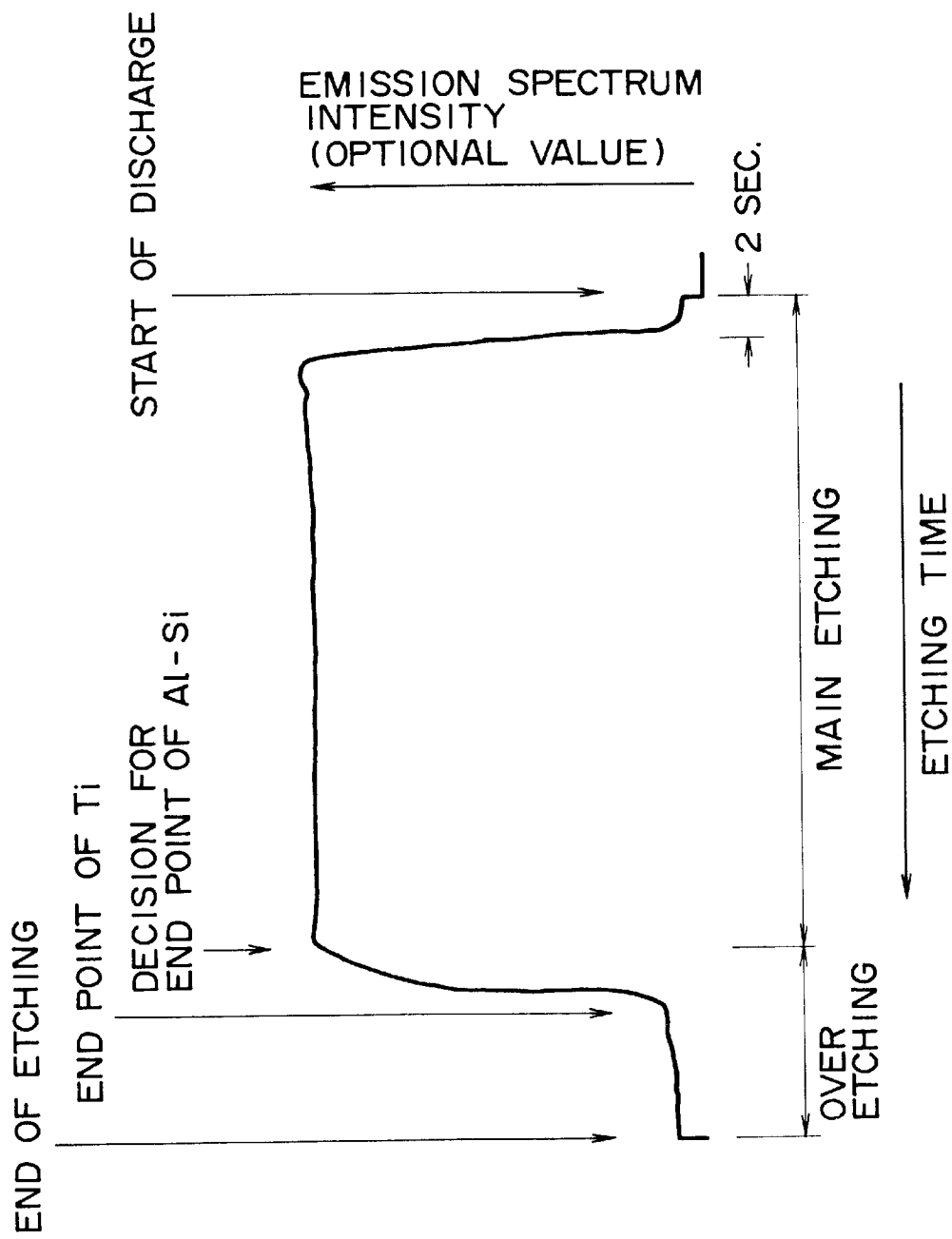
FIG. 2 shows variation with time of emission spectrum intensity of aluminum Al in the first embodiment of the present invention.

FIG. 2 shows a graph indicating changes with time of emission spectrum intensity in the wavelength of 396 nm during the patterning of a laminated structure of the Al-based metal layer 4 and the Ti layer 3. About two (2) seconds are required until emission spectrum of Al appears from the start of discharge. It suggests that a lag time of the etching by the native oxide at the surface of the Al-based metal layer is comparatively short and sufficiently practical plasma etching of the Al-based metal layer is enabled only with the HCl gas without requiring a reduction gas such as $BCl_3$.

Figure 1C:
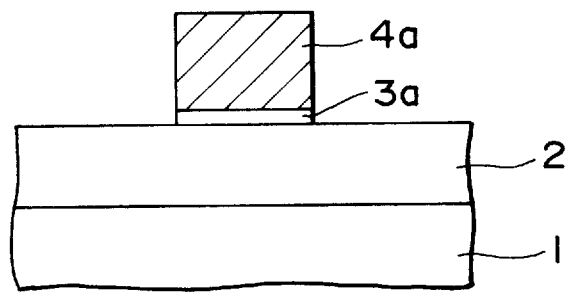

After completion of the patterning, the substrate to be processed is carried to an ashing apparatus to remove the resist mask 5 and the side wall protection film 6 by the $O_2$ plasma ashing process. The side wall protection film 6 can also be removed by the wet processing. FIG. 1C shows a completed Al-based metal wiring.

According to this embodiment, a rigid side wall protection film is formed by employment of the etching gas composed only of the HCl gas, enabling anisotropic etching of the Al-based metal layer even with a rather lower RF bias power. Therefore, the selectivity for resist mask can be improved and very controllable fine processing can be realized following to the pattern of resist mask. In addition, since a small amount of chlorine is left in the resist mask, it is effective for reduction of after-corrosion. Moreover, since a small amount of carbon-based polymer is produced by the sputtering of resist mask, there is no particle contamination of the substrate to be processed and at the inside of the etching chamber. Particularly, since there is no deposition of the carbon-based polymer even when several sheets of substrate to be processed are stacked, the maintenance steps of the chamber cleaning can be reduced.

Next, the second embodiment of the present invention shows an example where $BCl_3$ is added to HCl and the Al-based metal layer is plasma-etched by changing a gas mixing ratio to obtain the etching rate thereof. In more detail, as the samples for evaluation of selectivity, the plasma etching is carried out for resist, polycrystal silicon, Ti and silicon nitride layer under the same condition. This processing will be explained with reference to FIG. 3 and FIG. 4.

The substrate to be processed used in this second embodiment is similar to that shown in FIG. 1A and the same explanation is not repeated here. As the samples for comparison, those where the resist of the same pattern as the substrate to be processed is formed on the polycrystal silicon, Ti and silicon nitride layer are used. The polycrystal silicon is deposited by the reduced-pressure CVD method, while the silicon nitride layer by the plasma CVD method. In regard to the resist, its etching rate is obtained from reduction of resist mask on the substrate to be processed. These substrates to be processed and samples for comparison are patterned under the plasma etching conditions explained hereunder.

Flow rate of $HCl+BCl_3$: 140 sccm
$BCl_3$ mixing ratio: 0% to 37.5%
Gas pressure: 2.1 Pa
Microwave current: 300 mA (2.45 GHz)
RF bias power: 25 W (2 MHz)
Substrate temperature: 30° C.

A mixing ratio of $BCl_3$ indicates a flow rate of $BCl_3$ in the total flow rate when the total flow rate of HCl and $BCl_3$ is set to a constant value of 140 sccm.

Figure 3:
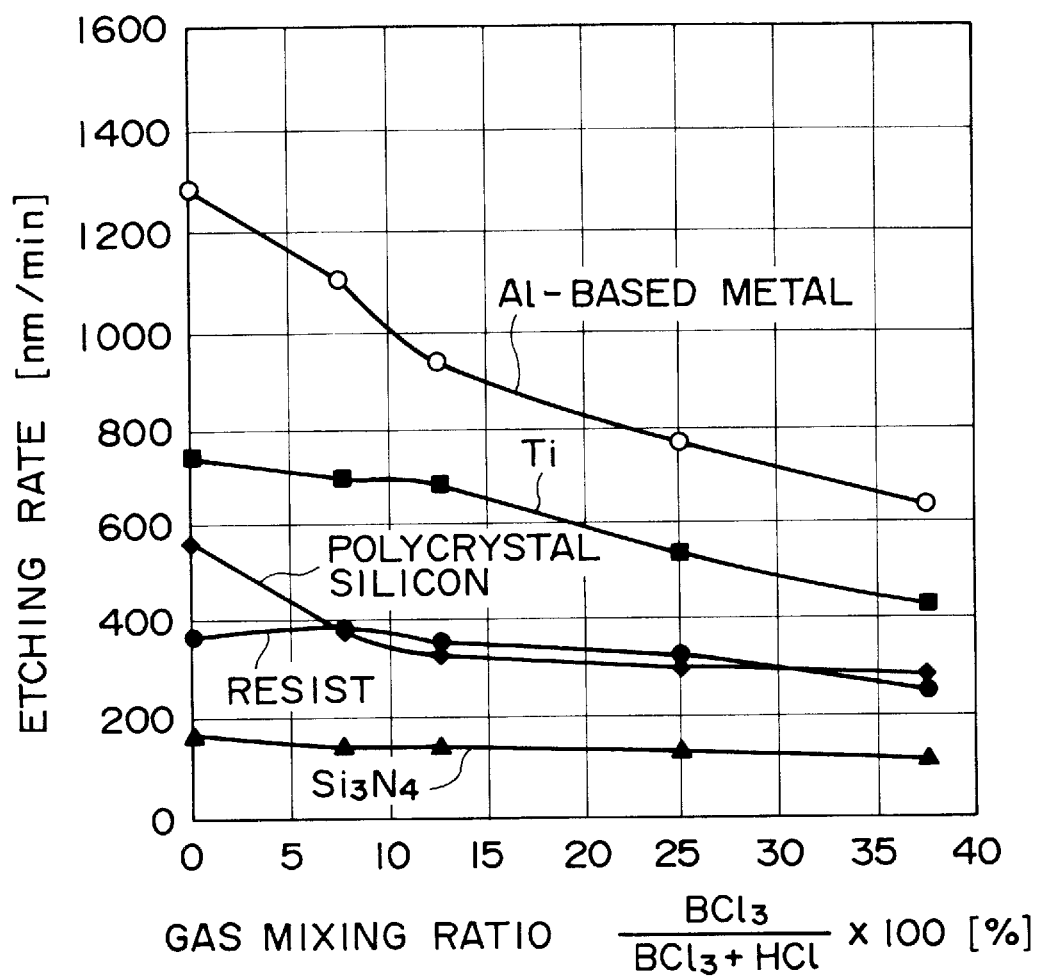
FIG. 3 shows a relationship between an etching rate of each material layer and a mixing ratio of $BCl_3$ in the second embodiment of the present invention.

As is apparent from FIG. 3 showing a relationship between an etching rate of each material layer and $BCl_3$ gas mixing ratio, an etching rate of each material layer as well as the Al-based metal layer generally tends to be lowered when the $BCl_3$ gas mixing ratio increases. Particularly, the etching rate of the Al-based metal layer never exceeds 1000 nm/min when the $BCl_3$ gas mixing ratio goes beyond 10%. It can be understood that the desirable $BCl_3$ mixing ratio should be under 10% because the practical etching rate of the Al-based metal layer is considered as 1000 nm/min or higher. Moreover, it is a reason for limiting the $BCl_3$ mixing ratio that when the $BCl_3$ mixing ratio exceeds 10%, drop of shoulder region of the resist mask can be observed.

Figure 4:
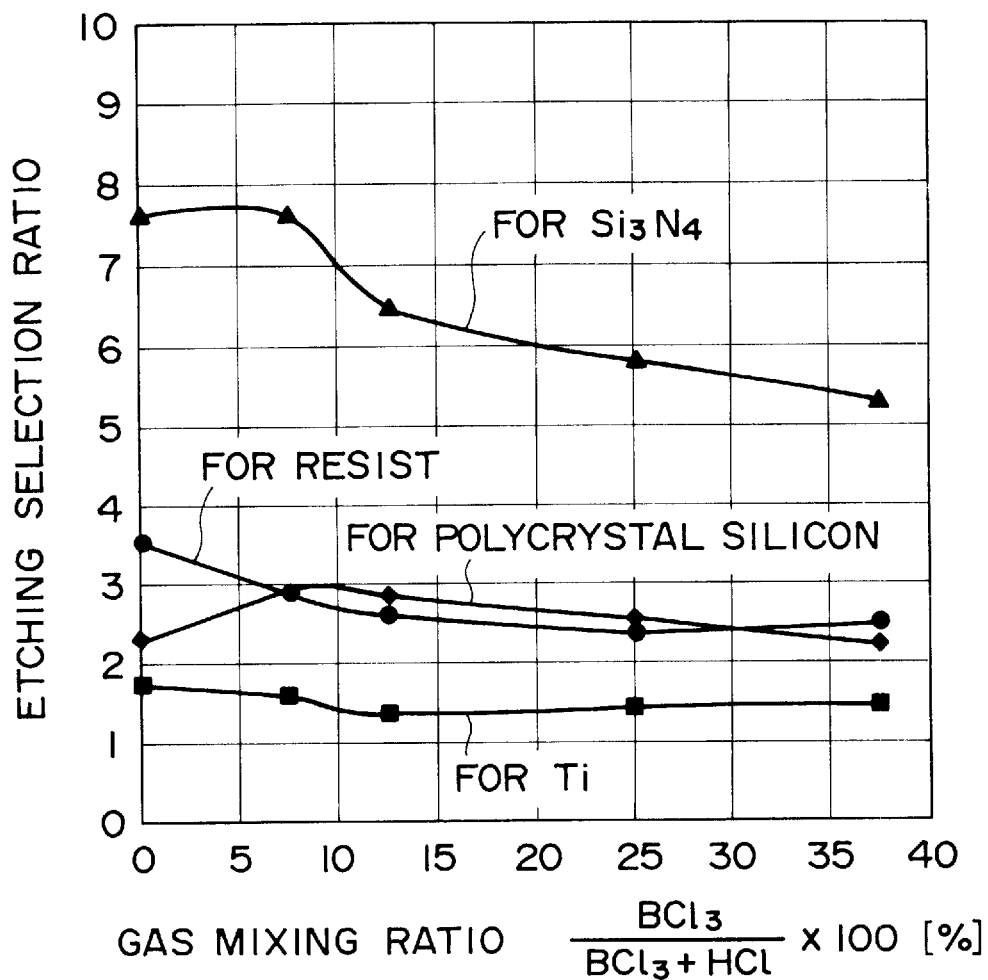
FIG. 4 shows a relationship between a selectivity for etching of the Al-based metal layer of each material layer and a mixing ratio of $BCl_3$ in the second embodiment of the present invention.

FIG. 4 shows a relationship between the etching selectivity of the Al-based metal layer vs. each material layer and $BCl_3$ mixing ratio. The selectivity for resist is under 3.1 when the $BCl_3$ mixing ratio is 5%, while it is under 2.7 when the $BCl_3$ mixing ratio exceeds 10%. The selectivity for polycrystal silicon shows the peak value of 3.0 when the $BCl_3$ mixing ratio is about 10%. When the $BCl_3$ mixing ratio is 5%, such selectivity for the polycrystal silicon drops to 2.7. Meanwhile, the selectivity for silicon nitride is 7.0 or larger which is a preferable value not resulting in any problem when the $BCl_3$ mixing ratio is under 10%.

When considering feedback to the actual process from above result, it can be understood, from the viewpoint of the etching rate of the Al-based metal layer and selection for resist, that the preferable $BCl_3$ mixing ratio is under 10%, that is, the preferable HCl mixing ratio is 90% or higher but is 100% or lower. Moreover, it can also be understood that the particularly preferable $BCl_3$ mixing ratio is under 5% in order to lower the selectivity for polycrystal silicon and reduce the amount of Si residue.

The third embodiment of the present invention shows an example where an etching rate of the Al-based metal layer is obtained by changing a flow rate of HCl in the plasma etching of the Al-based metal layer with the etching gas of only HCl. As the samples for evaluation of selectivity, the plasma etching is conducted for the resist, polycrystal silicon, Ti and silicon nitride layer under the same condition. This processing will be explained with reference to FIG. 5 and FIG. 6.

The substrate to be processed used in this third embodiment is also similar to that of FIG. 1A and the same explanation is not repeated here. As the samples for comparison, those obtained by forming the resist mask in the same pattern as that of the substrate to be processed on the polycrystal silicon, Ti and silicon nitride layer have been used. The polycrystal silicon has been deposited by the reduced-pressure CVD method, while the silicon nitride layer by the plasma CVD method. An etching rate of the resist has been obtained from the amount in the film reduction of the resist mask on the substrate to be processed. These substrates to be processed and samples for comparison have been patterned under the following plasma etching conditions.

Flow rate of HCl: 40 to 220 sccm

Gas pressure: 2.1 Pa

Microwave current: 300 mA (2.45 GHz)

RF bias power: 25 W (2 MHz)

Substrate temperature: 30° C.

Figure 5:
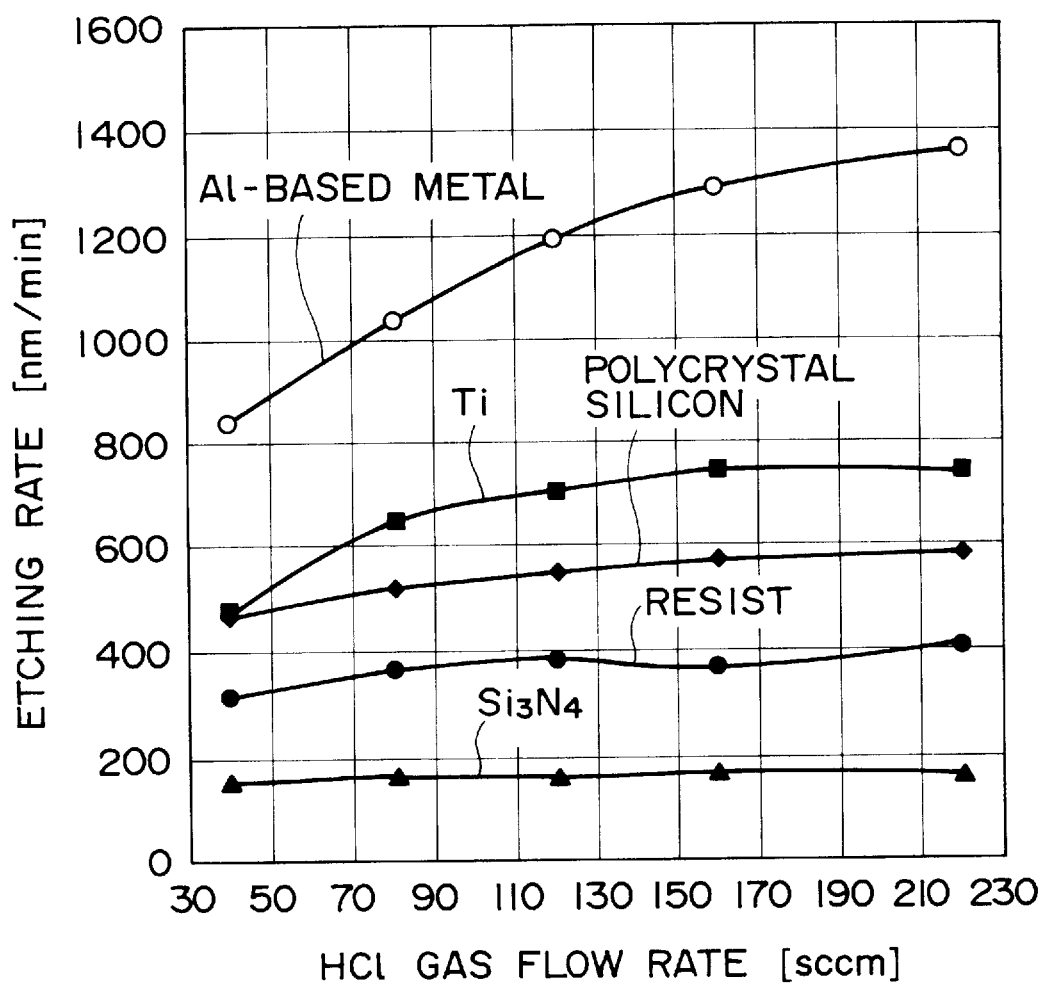
FIG. 5 shows a relationship between an etching rate of each material layer and a flow rate of HCl in the third embodiment of the present invention.

As is apparent from FIG. 5 showing the relationship between etching rate of each material layer and flow rate of HCl gas, when the flow rate of HCl increases, the etching rates of the Al-based metal layer and Ti layer increase remarkably. However, increase in the etching rates of the polycrystal silicon layer and resist layer is only a little. In regard to the silicon nitride layer, any change of etching rate almost cannot be observed. In any flow rate of the HCl gas, the Al-based metal layer pattern has been patterned with good anisotropy. Moreover, shoulder drop of the resist mask has not been detected and pattern conversion difference has not be recognized.

Relationship between etching selectivity of the Al-based metal layer vs. each material layer and flow rate of HCl gas is shown in FIG. 6. The selectivity for the silicon nitride layer conspicuously increases to 8.2 from 5.3 with increase of the flow rate of HCl gas, reflecting the values of the etching rates explained above. Meanwhile, for the resist layer and polycrystal silicon layer, a selectivity also increases with an increase of the flow rate of HCl gas, but such increase is not so remarkable as that for the silicon nitride layer. For the Ti layer, a significant difference in variation of the selectivity due to the flow rate of HCl gas cannot be detected.

When considering the feedback to the actual process from above total results, it is obvious that the condition that the etching selectivity for the polycrystal silicon layer is small, that is, the plasma etching condition for having reduced the flow rate of HCl is just suitable for preventing Si residue during the main etching of the Al-based metal layer consisting of Al-Si of 1%. Moreover, it can also be understood that the condition that the etching selectivity is high for the exposed silicon nitride layer as the underlayer, that is, the plasma etching condition having increased the flow rate of HCl is advantageous, in the over-etching stage during the patterning of the Al-based metal layer, for prevention of film reduction and surface roughness of the silicon nitride layer as the underlayer.

Figure 7A:
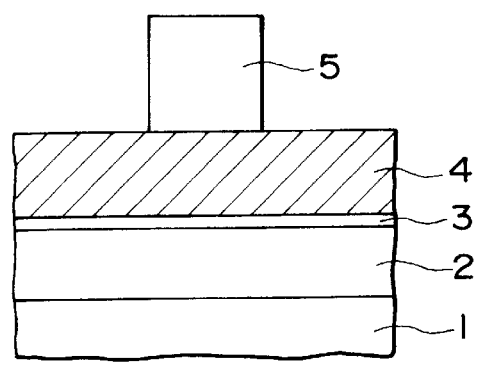

The fourth embodiment of the present invention shows an example where the result of the third embodiment is reflected on the actual process and thereby the Al-based metal layer is etched in the two stages only with the HCl gas. This example will be explained with reference to FIGS. 7A to 7D and FIG. 8. The substrate to be processed used in this embodiment shown in FIG. 7A is similar to that shown in FIG. 1A used in the first embodiment and the same explanation is not repeated here.

The substrate to be processed is set on a substrate stage of a substrate bias impression type ECR plasma etching apparatus and the first patterning process is carried out, as an example, to conduct the main etching of the Al-based metal layer 4 under the following plasma etching condition.

Flow rate of HCl: 80 sccm

Gas pressure: 2.1 Pa

Microwave current: 300 mA (2.45 GHz)

RF bias power: 25 W (2 MHz)

Substrate temperature: 30° C.

Figure 7B:
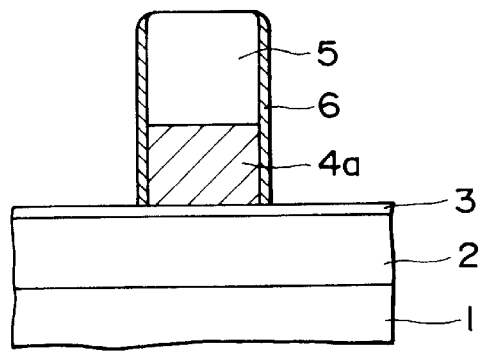
FIG. 7B illustrates the condition that the main etching is conducted for the Al-based metal layer during formation of a side wall protection film.

The above plasma etching condition is similar to that in the first embodiment, but the main etching has been terminated in this embodiment, when the Ti layer 3 as the underlayer has started to be exposed. Decision for the end point of the main etching has been defined to the timing where the emission intensity of 396 nm has started to be attenuated in the figure showing the changes with time of the emission spectrum intensity of aluminum Al shown in FIG. 8. In this main etching process, the etching proceeds in such a mechanism that the radical reaction using Cl* generated by discharge dissociation of HCl as the main etching seed is assisted by ion such as $Cl_x^+$ and the Al-based metal layer 4 has been removed while forming the reaction byproduct $AlCl_x$. Since the selectivity condition for polycrystal silicon layer is as low as 2.0, the Al-based metal layer 4 consisting of Al-Si of 1% has been patterned without generation of Si residue to form the Al-based metal layer pattern 4a as shown in FIG. 7B. Although not illustrated in this figure, a remainder of the Al-based metal layer 4 is left as the unetched region at the surface of the Ti layer 3 exposed in the final stage of the main etching.

Simultaneously, the side wall protection film 6 consisting of the carbon-based polymer derived from a decomposition byproduct of the resist mask 5 is adhered on the side surfaces of the formed Al-based metal layer pattern 4a and resist mask, making contribution to the anisotropic processing. The side wall protection film 5 in this embodiment is formed extending up to the upper part of the side surface (shoulder region) of the resist mask 5 as in the case of the first embodiment. Therefore, film reduction (shoulder drop) in the width direction of the resist mask 5 cannot be observed, making much contribution to reduction of the size conversion difference. In addition, since the active seed of hydrogen H generated by discharge dissociation of HCl seizes Cl*, the carbon-based polymer constituting the side wall protection film 6 contains less amount of Cl than the side wall protection film formed by the conventional process using a mixed gas of $BCl_3/Cl_2$ and is formed rigid having a higher degree of polymerization. This carbon-based polymer is not so much produced as that under the conventional etching condition because the RF bias is set to a rather lower value, but the side wall protection film 6 shows a higher etching-proof characteristic, making much contribution to the anisotropic processing of the Al-based metal wiring. In FIG. 7B, thickness of this side wall protection film 6 is somewhat exaggerated, but this film is actually a very thin, generating less amount of pattern conversion difference due to excessive side wall protection effect.

When the main etching of the Al-based metal layer 4 is terminated, the 40%-overetching has been conducted as the second patterning process under the plasma etching condition.

Gas pressure: 2.1 Pa

Microwave current: 300 mA (2.4 GHz)

RF bias power: 25 W (2 MHz)

Substrate temperature: 30° C.

This plasma etching is different from the plasma etching condition in the main etching only in the point that the flow rate of HCl increases and the other etching conditions are same.

Figure 7C:
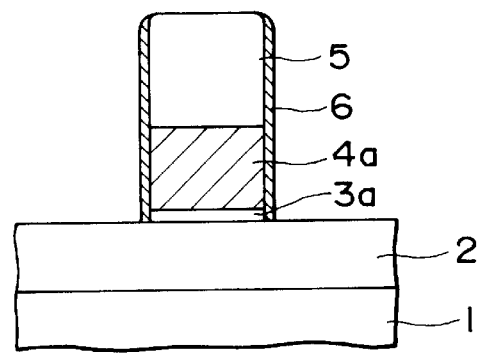
FIG. 7C illustrates the condition that remaining part of the Al-based metal layer and the Ti layer are over-etched.
Figure 7D:
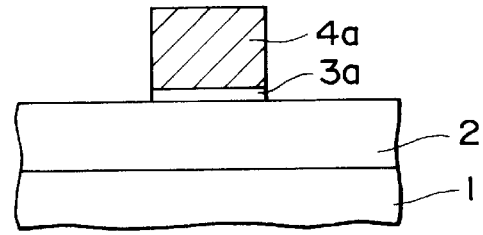
FIG. 7D illustrates the condition that the resist mask and side wall protection film are removed to complete the Al-based metal layer pattern.

In this over-etching process, a remaining part of the Al-based metal layer 4 (not illustrated) and the Ti layer 3 are removed and the Al-based metal layer pattern 4a and the Ti layer pattern 3a are formed as shown in FIG. 7C. Moreover, in this plasma etching condition, the selectivity for silicon nitride is as high as 8.2 and surface roughness and film reduction of the insulating layer 2 as the underlayer have effectively been reduced. With contribution by the active hydrogen H produced by dissociation of HCl to seize the excessive Cl*, the side etching and undercut of the Al-based metal layer pattern 4a have not been generated.

After completion of the patterning, the substrate to be processed is carried into an ashing apparatus to remove the resist mask 5 and side wall protection film 6 with the $O_2$ plasma ashing. The side wall protection film 6 can also be removed by the wet processing.

According to this fourth embodiment, with employment of two stages of the etching process with only the HCl gas, generation of Si residue can be prevented and the patterning of the Al-based metal layer which has lowered surface roughness and film reduction of the underlayer insulating film can be realized. Anisotropic etching of the Al-based metal layer is of course possible by means of formation of a rigid side wall protection film even when rather lower RF bias power is set. Therefore, the selectivity for resist mask can be improved and the fine processing which assures better controllability faithful to the resist mask pattern can be realized. Moreover, since the resist mask includes a lesser amount of residual chlorine, it is effective for reduction of after-corrosion. Moreover, since a lesser amount of carbon-based polymer is produced by the sputtering of the resist mask, the particle contamination cannot be observed on the substrate to be processed and at the inside of the etching chamber. Particularly, since a less amount of carbon-based polymer is accumulated even when a plurality of sheets of the substrate to be processed are stacked, the maintenance steps of the chamber cleaning can be reduced.

The present invention has been explained depending on the four kinds of preferred embodiments thereof, but the present invention is not limited thereto.

First, in each embodiment explained above, a laminated structure consisting of the Ti layer formed on the insulating layer as the Al-based metal wiring and the Al-based metal layer is indicated, but the other layer structures other than such structure can also be employed. For example, a barrier layer such as TiN layer, etc. may be included between the Ti layer and the Al-based metal layer. Moreover, a reflection preventing layer such as TiON layer may also be formed on the Al-based metal layer. In addition, such reflection preventing layer can also be used for the patterning of the Al-based metal layer. Such layer structure is attracting attention as the measure for stress migration.

As the Al-based metal layer, As-Si of 1% has been indicated but the pure Al and various alloys such as Al-0.1% Si-0.5% Cu and Al-Cu may also be used without any consideration on the film forming method.

As the interlayer insulating film forming the underlayer, silicon nitride formed by the p-CVD method has been indicated but other insulating layers such as $SiO_2$ and SiON, etc. may also be used. Particularly, when the underlayer is formed of $SiO_2$, since a large etching selectivity for the Al-based metal layer can be obtained in comparison with the case where the underlayer is formed of silicon nitride, the process margin can be expanded.

As the boron halogenide gas, $BCl_3$ has been used but $BBr_3$ can also be used in place of it. The rare gases such as Ar, He, etc. or a gas which seizes halogen such as CO, NO, $H_2$, etc. to control its concentration can further be added to the etching gas.

As the etching apparatus, a substrate bias impression type ECR plasma etching apparatus has been used but a more ordinary diode parallel plate RIE apparatus, a helicon wave plasma etching apparatus which enables processing by high density plasma, an ICP (Inductively Coupled Plasma) etching apparatus and a TCP (Transformer Coupled Plasma) etching apparatus, etc. can also be used.

As will be obvious from the above explanation, the plasma etching method for the Al-based metal layer of the present invention can offer a fabrication process suitable for ultra-fine processing which assures a large selectivity not only for resist mask but also for interlayer insulating film.

Moreover, the present invention attains, by employment of a side wall protection film having a rigid film quality, the anisotropic processing even when a film thickness is reduced and enables the plasma etching of the Al-based metal layer with excellent anisotropic shape without resulting in rise of particle level due to excessive deposition of the film and generation of pattern conversion difference.

Moreover, according to the present invention, the patterning method for the Al-based metal wiring which is suitable for reduction of the after-corrosion can be provided because contents of cl in the side wall protection film can be reduced. The after-corrosion prevention effect can further be reinforced in combination with the plasma processing including the F-based gas after the patterning of the Al-based metal layer.

As described previously, the present invention offers an excellent plasma etching method for the Al-based metal wiring which can sufficiently deal with thinner resist mask as a result of the ultra-microsegmentation of the design rules.

What is claimed is:

1. A method of plasma etching of an Al-based metal layer wherein said Al-based metal layer is etched using an etching gas comprising a positive amount of HCl and a positive amount of boron halogenide, wherein a volume ratio of HCl in said etching gas is greater than 90%, and wherein said etching gas further includes boron halogenide gas in the volume ratio of under 10%.

2. The method of plasma etching of an Al-based metal layer according to claim 1, wherein said boron halogenide gas is any one of $BCl_3$ and $BBr_3$.

3. The method of plasma etching of an Al-based metal layer according to any one of claims 1 and 2, wherein said Al-based metal layer is any one of pure Al, Al-Si alloy, Al-Si-Cu alloy and Al-Cu alloy.

4. The method of plasma etching of an Al-based metal layer according to any one of claims 1 and 2, wherein a Ti-based material layer is provided as the underlayer of the Al-based metal layer and said Ti-based material layer is etched after the etching of said Al-based metal layer.

5. The method of plasma etching of an Al-based metal layer according to any one of claims 1 and 2, wherein a Ti-based material layer is provided as an upper layer of the Al-based metal layer and said Al-based metal layer is etched after the etching of said Ti-based material layer.

6. The method of plasma etching of an Al-based metal layer according to any one of claims 1 and 2, wherein a mask for patterning said Al-based metal layer is a photoresist.

7. A method of plasma etching of an Al-based metal layer comprising a first patterning process for main etching of said Al-based metal layer using an etching gas comprising HCl and a second patterning process for over-etching of said Al-based metal layer into an underlayer of the Al-based metal layer, wherein an etching rate of the etching gas is decreased during etching of said underlayer, wherein a volume ratio of HCl in said etching gas is greater than or equal to 90% in said first and second patterning processes.

8. A method of plasma etching of an Al-based metal layer comprising a first patterning process for main etching of said Al-based metal layer using an etching gas comprising HCl and a second patterning process for over-etching of said Al-based metal layer into an underlayer of the Al-based metal layer, wherein an etching rate of the etching gas is decreased during etching of said underlayer, and wherein an etching gas further includes boron halogenide gas in a volume ratio under 10% in said first and second patterning processes.

9. The method of plasma etching of an Al-based metal layer according to claim 8, wherein said boron halogenide gas is any one of $BCl_3$ and $BBr_3$.

10. The method of plasma etching of an Al-based metal layer according to any one of claims 7, 8 and 9, wherein said Al-based metal layer is any one of pure Al, As-Si alloy, Al-Si-Cu alloy and As-Cu alloy.

11. The method of plasma etching of an Al-based metal layer according to any one claims 7, 8 and 9, wherein a Ti-based material layer is provided as the underlayer of the Al-based metal layer and said Ti-based material layer is etched after the etching of said Al-based metal layer.

12. The method of plasma etching of an Al-based metal layer according to any one of claims 7, 8 and 9, wherein a Ti-based material layer is provided as an upper layer of the Al-based metal layer and said Al-based metal layer is etched after the etching of said Ti-based material layer.

13. The method of plasma etching of an Al-based metal layer according to any one of claims 7, 8 and 9, wherein a mask for patterning said Al-based metal layer is a photoresist.

* * * * *